(12) United States Patent
Pan et al.

(10) Patent No.: US 10,320,371 B2
(45) Date of Patent: *Jun. 11, 2019

(54) METHOD AND APPARATUS FOR REDUCING IMPACT OF TRANSISTOR RANDOM MISMATCH IN CIRCUITS

(71) Applicant: Micron Technology, Inc., Boise, ID (US)

(72) Inventors: Dong Pan, Boise, ID (US); John D. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/121,237

(22) Filed: Sep. 4, 2018

(65) Prior Publication Data

US 2018/0375502 A1    Dec. 27, 2018

Related U.S. Application Data

(63) Continuation of application No. 15/482,020, filed on Apr. 7, 2017, now Pat. No. 10,097,169.

(51) Int. Cl.
*H03K 5/007* (2006.01)
*H03K 5/156* (2006.01)
(Continued)

(52) U.S. Cl.
CPC ......... *H03K 5/007* (2013.01); *H03F 3/45475* (2013.01); *H03F 3/45977* (2013.01);
(Continued)

(58) Field of Classification Search
CPC ..... H03K 5/007; H03K 5/1565; H03K 17/161
(Continued)

(56) References Cited

U.S. PATENT DOCUMENTS

| 4,190,805 A | 2/1980 | Bingham |
| 4,808,942 A | 2/1989 | Milkovic |

(Continued)

OTHER PUBLICATIONS

"International Application Serial No. PCT/US2018/026511, International Search Report dated Jul. 27, 2018", 3 pgs.
(Continued)

*Primary Examiner* — William Hernandez
(74) *Attorney, Agent, or Firm* — Schwegman Lundberg & Woessner, P.A.

(57) ABSTRACT

An analog circuit including a pair of input nodes and a pair of output nodes is coupled to a mismatch reduction circuit including an input node, an output node, a phase controller that times even and odd phases, an input switch, and an output switch. The input switch electrically connects the mismatch reduction circuit input node to a first node of the pair of analog circuit input nodes during each even phase and to electrically connects the mismatch reduction circuit input node to a second node of the pair of analog circuit input nodes during each odd phase. The output switch electrically connects a first node of the pair of analog circuit output nodes to the mismatch reduction circuit output node during each even phase and electrically connects a second node of the pair of analog circuit output nodes to the mismatch reduction circuit output node during each odd phase.

20 Claims, 6 Drawing Sheets

(51) Int. Cl.
*H03K 17/16* (2006.01)
*H03F 3/45* (2006.01)
*H03M 3/00* (2006.01)

(52) U.S. Cl.
CPC ....... *H03F 3/45995* (2013.01); *H03K 5/1565* (2013.01); *H03K 17/161* (2013.01); *H03M 3/00* (2013.01); *H03F 2203/45212* (2013.01)

(58) Field of Classification Search
USPC ........................................ 327/378, 379, 382
See application file for complete search history.

(56) References Cited

U.S. PATENT DOCUMENTS

| | | |
|---|---|---|
| 5,124,663 A | 6/1992 | Mcentarfer et al. |
| 6,388,521 B1 | 5/2002 | Henry |
| 6,911,858 B2 | 6/2005 | Mori |
| 7,236,117 B1 | 6/2007 | Varma et al. |
| 7,394,309 B1 | 7/2008 | Potanin et al. |
| 8,258,854 B2 | 9/2012 | Pan |
| 9,912,309 B1 | 3/2018 | Ecker et al. |
| 9,941,852 B1 * | 4/2018 | Abughazaleh ....... H03G 1/0088 |
| 2009/0129438 A1 | 5/2009 | Pan |
| 2011/0006831 A1 | 1/2011 | Pan |
| 2012/0161991 A1 | 6/2012 | Zhang |
| 2013/0127526 A1 | 5/2013 | Sayuk |
| 2016/0012868 A1 | 1/2016 | Moon et al. |

OTHER PUBLICATIONS

"International Application Serial No. PCT/US2018/026511, Written Opinion dated Jul. 27, 2018", 5 pgs.

* cited by examiner

US 10,320,371 B2

METHOD AND APPARATUS FOR REDUCING IMPACT OF TRANSISTOR RANDOM MISMATCH IN CIRCUITS

PRIORITY APPLICATION

This application is a continuation of U.S. application Ser. No. 15/482,020, filed Apr. 7, 2017, which is incorporated herein by reference in its entirety.

BACKGROUND

Random offsets resulting from transistor random mismatch can be found in analog circuits such as an operational amplifier, a comparator, a current mirror, an analog-to-digital converter, and a digital-to-analog converter. Such offsets can affect circuit performance to unacceptable levels. An example for reducing the random offsets is the auto zero method that uses a capacitor to store and cancel the random offset. However, this method is limited to application in certain circuits, and limits the speed of such circuits, as every operation needs an equilibration phase.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. References to "an", "one", or "various" embodiments in this disclosure are not necessarily to the same embodiment, and such references contemplate more than one embodiment. The following detailed description provides examples, and the scope of the present invention is defined by the appended claims and their legal equivalents.

This document discusses, among other things, a system and method for reducing random offsets caused by transistor random mismatch in a circuit. In various embodiments, a digital means for such reducing random offsets can be implemented by hardware, software, or combination of hardware and software to support a fast operation in a high speed system or device. Examples of circuits implementing the present system can include, but are not limited to, an electronic circuit including a digital-to-analog converter (DAC), an analog-to-digital converter (ADC), and/or a comparator. While these examples are specifically discussed in this document, the present system and method can be applied to any circuit that includes one or more pairs of matching transistors to reduce random offsets resulting from transistor random mismatch.

Figure 1:
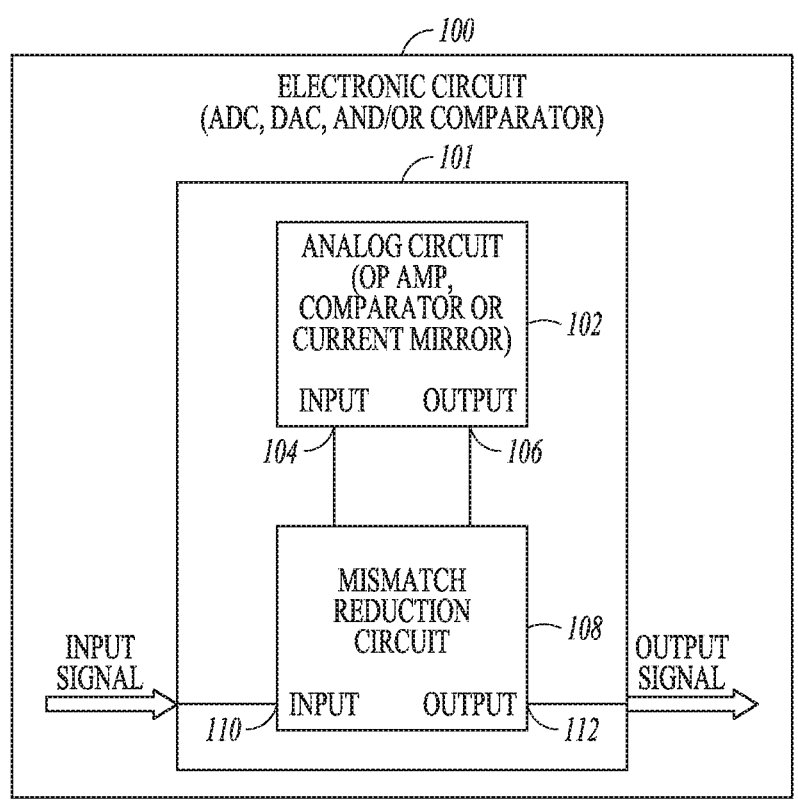
FIG. 1 illustrates an embodiment of an electronic circuit including a system with an analog circuit and circuitry for reducing impact of transistor random mismatch in the analog circuit.

FIG. 1 illustrates an embodiment of an electronic circuit 100 including a system 101 with an analog circuit 102 and a mismatch reduction circuit 108 for reducing impact of transistor random mismatch in analog circuit differential amplifier 102. In various embodiments, electronic circuit 100 can include an ADC, a DAC, and/or a comparator. System 101 can be part of any of the ADC, the DAC, and/or the comparator for which random offsets caused by transistor random mismatch need to be addressed. In various embodiments, analog circuit 102 can include an operational amplifier, a comparator, or a current mirror.

Analog circuit 102 includes an input 104 and an output 106. Input 104 can include a pair of differential input nodes, such as a positive (non-inverting) input node and a negative (inverting) input node. Output 106 can include a pair of complementary output nodes, such as a true output node and a complementary output node. Analog circuit 102 includes one or more pairs of matching transistors coupled between input 104 and output 106. The transistors of each pair of matching transistors may have transistor random mismatch that results in random offsets seen at output 106. Mismatch reduction circuit 108 is coupled to analog circuit 102 at its input 104 and output 106 to reduce the random offsets. Mismatch reduction circuit 108 includes an input 110 to receive an input signal and an output 112 to deliver an output signal.

In various embodiments, analog circuit 102 can include an operational amplifier, a comparator and/or a current mirror. System 101 may use such analog circuit 102 to process the input signal and use mismatch reduction circuit 108 to reduce the impact of transistor random mismatch on the signal processing to produce the output signal.

Figure 2:
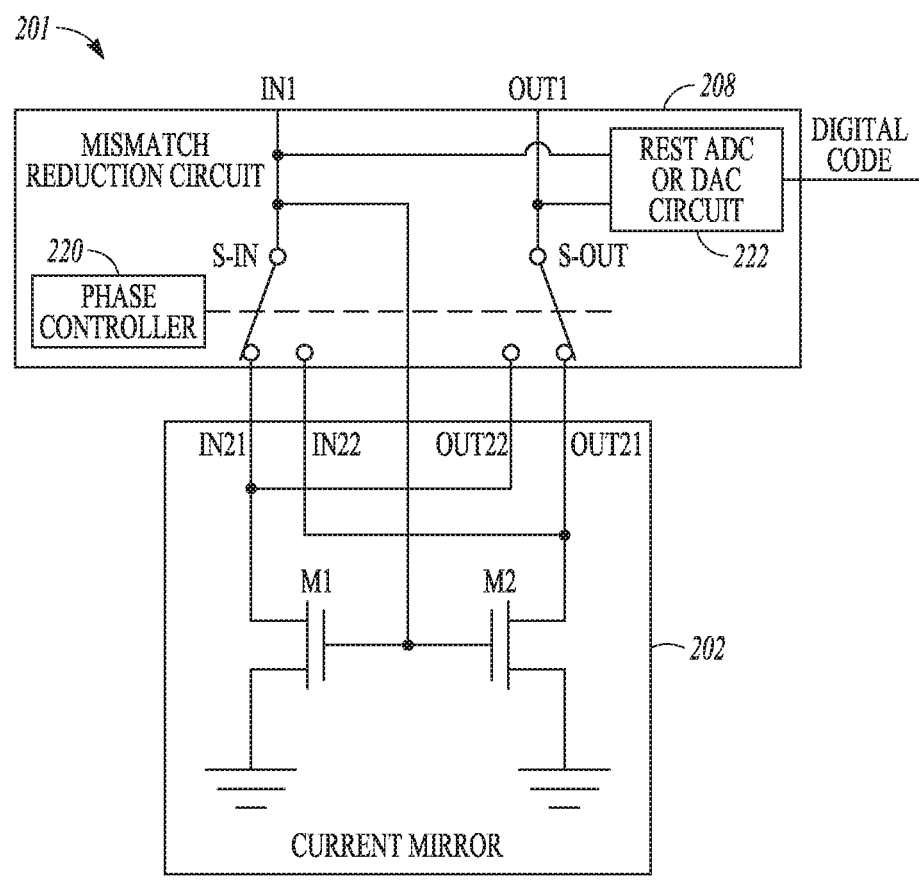
FIG. 2 illustrates an embodiment of the system of FIG. 1.

FIG. 2 illustrates an embodiment of a system 201, which represents an example of system 101. System 201 includes a current mirror 202 and a mismatch reduction circuit 208.

Current mirror 202 represents an example of analog circuit 102 of FIG. 1 and can include a pair of input nodes, a pair of output nodes, and one or more pairs of matching transistors. In the illustrated embodiment, the pair of input nodes include a first input node (IN21) and a second input node (IN22). The pair of output nodes include a first output node (OUT21) and a second output node (OUT22). A pair of matching transistors M1 and M2 may have transistor random mismatch resulting in random offsets at the output nodes. Input node IN21 and output node OUT21 are used when transistors M1 and M2 serve as current input and output transistors, respectively. Input node IN22 and output node OUT22 are used when transistors M2 and M1 serve as current input and output transistors, respectively.

Mismatch reduction circuit 208 represents an example of mismatch reduction circuit 108 of FIG. 1 and include an input node IN1, an output node OUT1, a phase controller 220, an input switch S-IN, an output switch S-OUT, and optionally a rest ADC or DAC output circuit 222.

Phase controller 220 can time one or more pairs of even and odd phases (e.g., phase 0, phase 1, phase 2, phase 3 . . . ). The even and odd phases can have a duration between 0.01 to 1000 microseconds.

Input switch S-IN is controlled by phase controller 220. Input switch S-IN can connect input node IN1 to input node IN21 during each even phase of the one or more pairs of even and odd phases, and can connect input node IN1 to input node IN22 during each odd phase of the one or more pairs of even and odd phases. Alternatively, input switch S-IN can connect input node IN1 to input node IN21 during each odd phase of the one or more pairs of even and odd phases, and can connect input node IN1 to input node IN22 during each even phase of the one or more pairs of even and odd phases.

Output switch S-OUT is also controlled by phase controller 220. Output switch S-OUT can connect output node OUT21 to output node OUT1 during each even phase of the one or more pairs of even and odd phases and connect output node OUT22 to output node OUT1 during each odd phase of the one or more pairs of even and odd phases. Alternatively, output switch S-OUT can connect output node OUT21 to output node OUT1 during each odd phase of the one or more pairs of even and odd phases and connect output node OUT22 to output node OUT1 during each even phase of the one or more pairs of even and odd phases.

Rest ADC or DAC circuit 222 (also referred to as an output circuit) can record (e.g., store at least temporary such as in a memory device) a digital code for each phase of the one or more pairs of even and odd phases, and can produce an averaged output signal being an average of the digital codes recorded for the one or more pairs of even and odd phases. In various embodiments, the number of pairs of even and odd phases used in calculating the average depends on the magnitude of the random offsets and/or their impact on the circuit performance. Such magnitude and/or impact may be estimated based on structure of the circuit. The averaging function can be achieved in mismatch reduction circuit 208 (as illustrated) or outside of mismatch reduction circuit 201, and can be achieved by hardware circuits or software codes.

Figure 3:
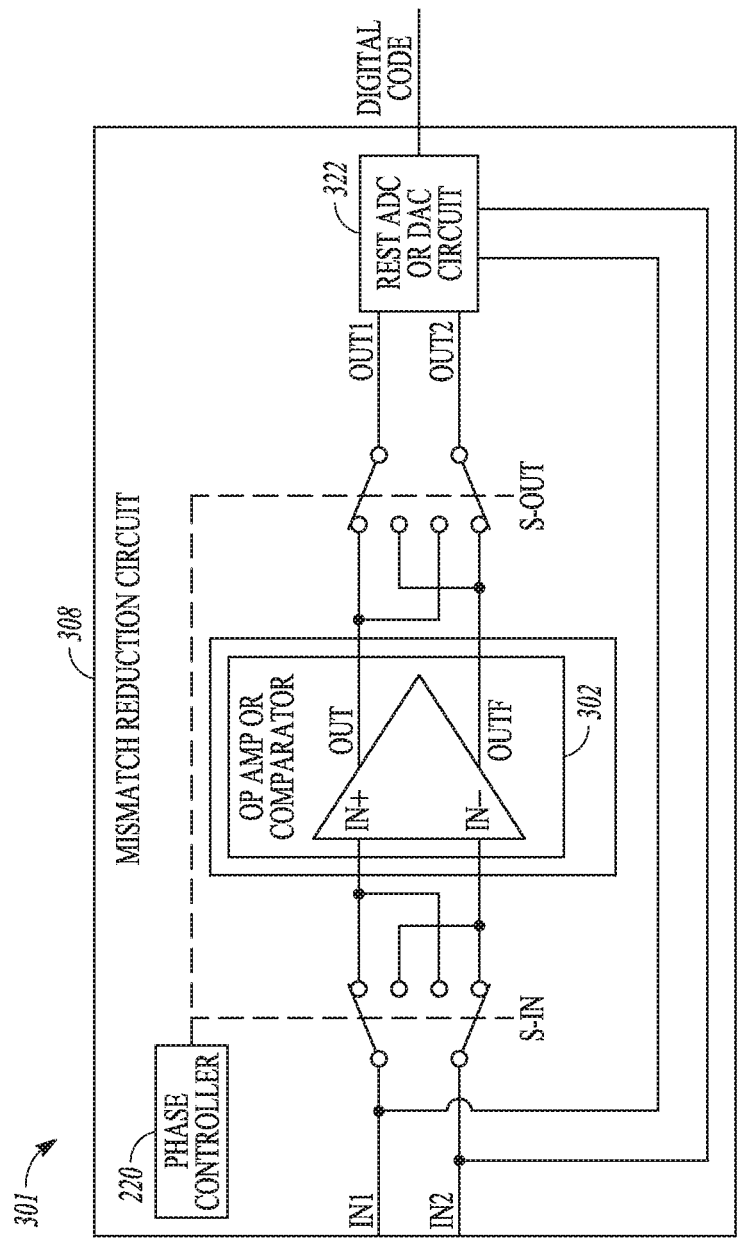
FIG. 3 illustrates another embodiment of the system of FIG. 1.

FIG. 3 illustrates another embodiment of a system 301, which represents another example of system 101. System 301 includes an op amp or comparator 302 and a mismatch reduction circuit 308.

Op amp or comparator 302 represents another example of analog circuit 102 of FIG. 1 and can include a pair of differential input nodes, a pair of complementary output nodes, and one or more pairs of matching transistors. In the illustrated embodiment, the pair of differential input nodes includes a positive (non-inverting) input node (IN+) and a negative (inverting) input node (IN−). The pair of complementary output nodes include a true output node (OUT) and a complementary output node (OUTF). Op amp or comparator 302 includes at least one pair of matching transistors, and can include multiple pairs of matching transistors, that may have transistor random mismatch resulting in random offsets at the true and/or complementary output nodes.

Mismatch reduction circuit 308 represents another example of mismatch reduction circuit 108 and includes a pair of first input node IN1 and second input node IN2, a pair of first output node OUT1 and second output node OUT2, a phase controller 220, an input switch S-IN, an output switch S-OUT, and optionally a rest ADC or DAC circuit 322.

Input switch S-IN is controlled by phase controller 220. Input switch S-IN can connect first input node IN1 to positive input node In+ and second input node IN2 to negative input node IN− during each even phase of the one or more pairs of even and odd phases, and can connect first input node IN1 to negative input node IN− and second input node IN2 to positive input node IN+ during each odd phase of the one or more pairs of even and odd phases. Alternatively, input switch S-IN can connect first input node IN1 to positive input node IN+ and second input node IN2 to negative input node IN− during each odd phase of the one or more pairs of even and odd phases, and can connect first input node IN1 to negative input node IN− and second input node IN2 to positive input node IN+ during each even phase of the one or more pairs of even and odd phases.

Output switch S-OUT is also controlled by phase controller 220. Output switch S-OUT can connect true output node OUT to first output node OUT1 and complementary output node OUTF to second output node OUT2 during each even phase of the one or more pairs of even and odd phases, and can connect complementary output node OUTF to first output node OUT1 and true output node OUT to second output node OUT2 during each odd phase of the one or more pairs of even and odd phases. Alternatively, output switch S-OUT can connect true output node OUT to first output node OUT1 and complementary output node OUTF to second output node OUT2 during each odd phase of the one or more pairs of even and odd phases, and can connect complementary output node OUTF to first output node OUT1 and true output node OUT to second output node OUT2 during each even phase of the one or more pairs of even and odd phases.

Rest ADC or DAC circuit 322 (also referred to as an output circuit) can record (e.g., store at least temporary such as in a memory device) a digital code for each phase of the one or more pairs of even and odd phases, and can produce an averaged output signal being an average of the digital codes recorded for the one or more pairs of even and odd phases. In various embodiments, the number of pairs of even and odd phases used in calculating the average depends on the magnitude of the random offsets and/or their impact on the circuit performance. Such magnitude and/or impact may be estimated based on structure of the circuit. The averaging function can be achieved in mismatch reduction circuit 308 (as illustrated) or outside of mismatch reduction circuit 301, and can be achieved by hardware circuits or software codes.

Figure 4:
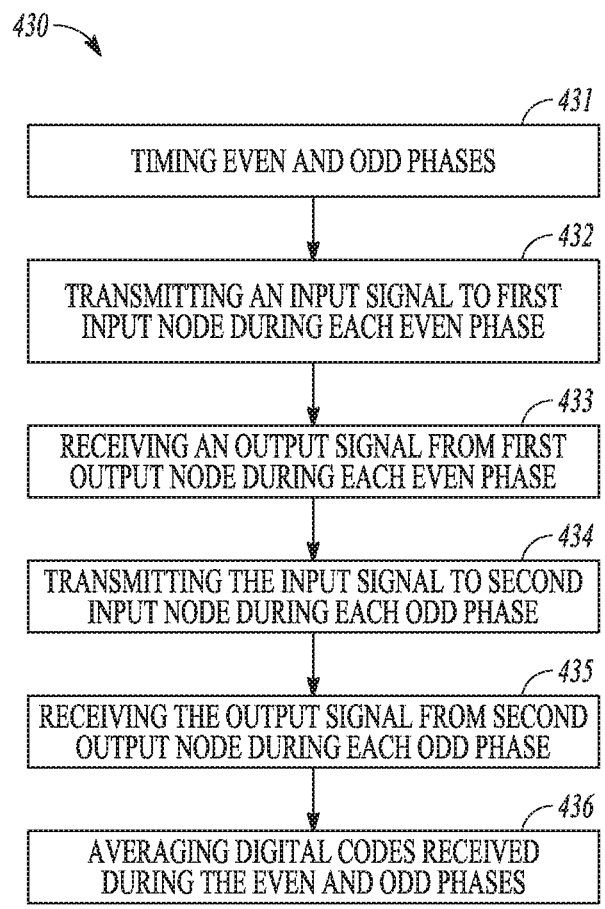
FIG. 4 illustrates an embodiment of a method for reducing impact of transistor random mismatch in a circuit.

FIG. 4 illustrates an embodiment of a method 430 for reducing impact of transistor random mismatch in a circuit. Method 430 can be applied in processing a signal using an electronic circuit including an ADC, a DAC, and/or a comparator. The electronic circuit includes one or multiple analog circuits having a pair of input nodes and a pair of output nodes. Method 430 can be performed, for example, using system 201 of FIG. 2.

At 431, one or more pairs of even and odd phases are timed, such as by using phase controller 220. At 432, an input signal is transmitted to a first node (e.g., IN21 in system 201) of the pair of input nodes during each even phase of the one or more pairs of even and odd phases. At 433, an output signal (e.g., including a digital code) is received from a first node (e.g., OUT21 in system 201) of the pair of output nodes during each even phase of the one or more pairs of even and odd phases. At 434, the input signal is transmitted to a second node (e.g., IN22 in system 201) of the pair of input nodes during each odd phase of the one or more pairs of even and odd phases. At 435, the output signal is received from a second node (e.g., OUT22) of the pair of output nodes during each odd phase of the one or more pairs of even and odd phases. Steps 432 and 434 can be performed, for example, using input switch S-IN in system 201. Steps 433 and 435 can be performed, for example, using input switch S-OUT in system 201. At 436, a digital codes is received from the output signal during each even phase and received from the output signal during each odd phase, and is averaged to produce an averaged digital code.

Figure 5:
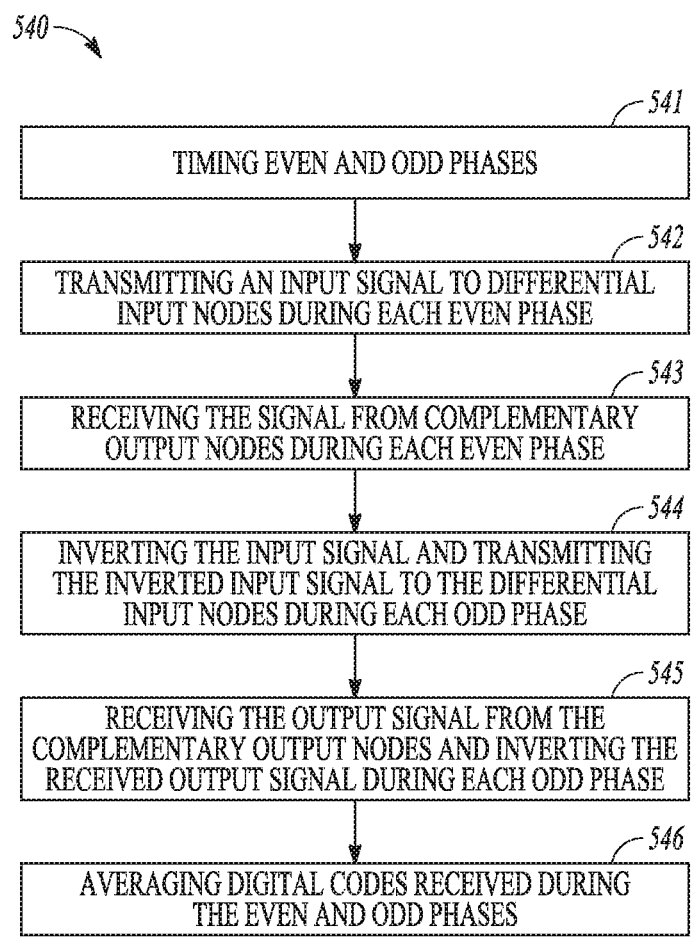
FIG. 5 illustrates another embodiment of a method for reducing impact of transistor random mismatch in a circuit.

FIG. 5 illustrates an embodiment of a method 540 for reducing impact of transistor random mismatch in a circuit. Method 540 can be applied in processing a signal using an electronic circuit including an ADC, a DAC, and/or a comparator. The electronic circuit includes at least one op amp or comparator circuit having a pair of differential input nodes and a pair of complementary output nodes. Method 540 can be performed, for example, using system 301 of FIG. 3.

At 541, one or more pairs of even and odd phases are timed, such as by using phase controller 220. At 542, an input signal is transmitted to the pair of differential input nodes (e.g., IN+ and IN− in system 301) during each even phase of the one or more pairs of even and odd phases. The transmitted input signal is a differential signal between the first and second nodes of the pair of differential input nodes. At 543, an output signal (e.g., including a digital code) is received from the pair of complementary output nodes (e.g., OUT and OUTF in system 301) during each even phase of the one or more pairs of even and odd phases. The received output signal is a differential signal between the first and second nodes of the pair of complementary output nodes. At 544, the input signal is inverted and transmitted to the pair of differential input nodes during each odd phase of the one or more pairs of even and odd phases. At 545, the output signal is received from the pair of complementary output nodes and inverted during each odd phase of the one or more pairs of even and odd phases. Steps 542 and 544 can be performed, for example, using input switch S-IN in system 301. Steps 543 and 545 can be performed, for example, using input switch S-OUT in system 301. At 546, a digital code is received from the output signal during each even phase and received from the output signal during each odd phase, and is averaged to produce an output digital code.

Figure 6:
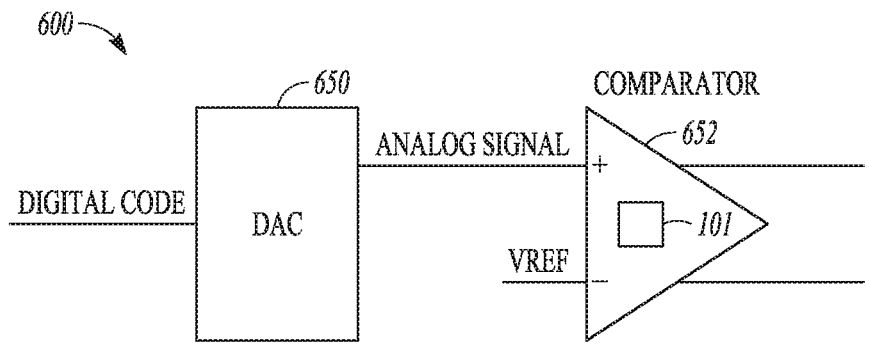
FIG. 6 illustrates an embodiment of a digital-to-analog converter (DAC) and comparator system including the system of FIG. 1.

FIG. 6 illustrates an embodiment of a DAC and comparator system 600 that includes system 101 (including its various examples as discussed in this document). The illustrated system includes a DAC 650 having a DAC input to receive a digital code and a DAC output to provide an analog signal, a comparator 652 having a first comparator input coupled to the DAC output to receive the analog signal, a second comparator input to receive a reference voltage signal VREF, and a comparator output. The degree of the impact of transistor random mismatch on output variation of system 600 depends on, and may be estimated from, the circuit structure of system 600. In various embodiments, comparator 652 includes system 101 (including any of its examples as discussed in this document) to reduce the impact of transistor random mismatch on the output variation.

In one embodiment, system 600 is implemented in a high-speed circuit for clock duty cycle calibration. In a high-speed system (e.g., with main clock frequency at 500 MHz or above), clock duty cycle calibration is important to ensure reliable high-speed operation. A circuit including system 600 can provide for the clock duty cycle calibration. The circuit receives an external clock signal and converts it to an internal clock signal that goes to a clock tree. The circuit has several trim bits to calibrate the duty cycle of the clock signal, and operates like a DAC. Low pass filters and a comparator are connected to the clock tree to monitor the duty cycle of the clock signal. The comparator has transistor random mismatch that can impact the accuracy of the duty cycle calibration. System 101 (including any of its examples discussed in this document) can be included in the comparator to improve the calibration accuracy by reducing the random offsets. The digital codes used in each phase can be averaged by either hardware circuits or software codes. The averaged digital code can then be used for proper clock duty cycle trims to reduce the impact of transistor random mismatch in the comparator.

Figure 7:
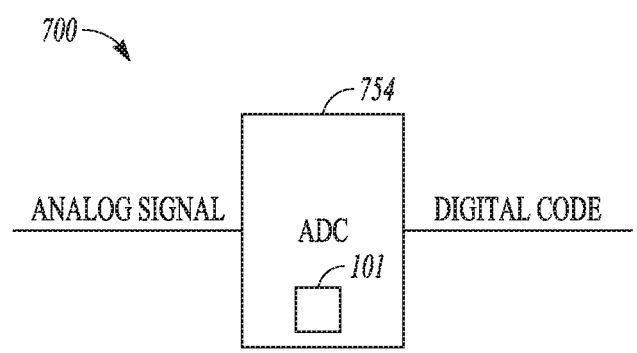
FIG. 7 illustrates an embodiment of an analog-to-digital converter (ADC) system including the system of FIG. 1.

FIG. 7 illustrates an embodiment of an ADC system 700 that includes system 101 (including its various examples as discussed in this document). In the illustrated embodiment, system 700 includes an ADC 754 that includes system 101. In another embodiment, ADC 754 can have an ADC output connected to a comparator that includes system 101. The degree of the impact of transistor random mismatch on output variation of system 700 depends on, and may be estimated from, the circuit structure of system 700. In various embodiments, system 700 includes system 101 (including any of its examples as discussed in this document) to reduce the impact of transistor random mismatch on the output variation.

Referring to both FIGS. 6 and 7, in one embodiment, transistor random mismatch has negligible impact on the output variation of system 600 or 700. Comparator 652 includes system 301 of FIG. 3. Phase controller 220 times one pair of even and odd phases: phase 0 and phase 1. Input switch S-IN connects first input node IN1 to positive input node IN+ and second input node IN2 to negative input node IN− during phase 0, and connects first input node IN1 to negative input node IN− and second input node IN2 to positive input node IN+ during phase 1. Alternatively, input switch S-IN connects first input node IN1 to negative input node IN− and second input node IN2 to positive input node IN+ during phase 0, and connects first input node IN1 to positive input node IN+ and second input node IN2 to negative input node IN− during phase 1. Output switch S-OUT connects true output node OUT to first output node OUT1 and complementary output node OUTF to second output node OUT2 during phase 0, and connect complementary output node OUTF to first output node OUT1 and true output node OUT to second output node OUT2 during phase 1. Alternatively, output switch S-OUT connects complementary output node OUTF to first output node OUT1 and true output node OUT to second output node OUT2 during phase 0, and connects true output node OUT to first output node OUT1 and complementary output node OUTF to second output node OUT2 during phase 1. Output circuit 322 record the signal at complementary output nodes OUT and OUTF for each of phases 0 and 1, and produce an average of the signal recorded for phases 0 and 1.

Referring to both FIGS. 6 and 7, in another embodiment, transistor random mismatch has significant impact on the output variation of system 600. Comparator 652 includes system 301 of FIG. 3. Phase controller 220 times two pairs of even and odd phases: phase 0, phase 1, phase 2, and phase 3. Input switch S-IN connects first input node IN1 to positive input node IN+ and second input node IN2 to negative input node IN− during each of phases 0 and 2, and connects first input node IN1 to negative input node IN− and second input node IN2 to positive input node IN+ during each of phases 1 and 3. Alternatively, input switch S-IN connects first input node IN1 to negative input node IN− and second input node IN2 to positive input node IN+ during each of phases 0 and 2, and connects first input node IN1 to positive input node IN+ and second input node IN2 to negative input node IN− during each of phases 1 and 3. Output switch S-OUT connects true output node OUT to first output node OUT1 and complementary output node OUTF to second output node OUT2 during each of phases 0 and 2, and connect complementary output node OUTF to first output node OUT1 and true output node OUT to second output node OUT2 during each of phases 1 and 3. Alternatively, output switch S-OUT connects complementary output node OUTF to first output node OUT1 and true output node OUT to second output node OUT2 during each of phases 0 and 2, and connects true output node OUT to first output node OUT1 and complementary output node OUTF to second output node OUT2 during each of phases 1 and 3. Output circuit 322 record the signal at complementary output nodes OUT and OUTF for each of phases 0, 1, 2, and 3, and produce an average of the signal recorded for phases 0, 1, 2, and 3.

While system 301 is discussed above as a specific example, system 600 or 700 can include one or more systems such as systems 201 and/or 301. In various embodiments, system 600 can include any DAC system with one or multiple critical matching devices in one or more op amps and/or one or more current mirrors, and system 700 can include any ADC system with one or multiple critical matching devices in one or more op amps and/or one or more current mirrors.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus, comprising;
    an analog circuit including a pair of analog circuit input nodes and a pair of analog circuit output nodes; and
    a mismatch reduction circuit including:
        a first mismatch reduction circuit input node;
        a first mismatch reduction circuit output node;
        a phase controller configured to time one or more pairs of even and odd phases;
        an input switch coupled to the phase controller and configured to electrically connect the first mismatch reduction circuit input node to a first node of the pair of analog circuit input nodes during each even phase of the one or more pairs of even and odd phases and to electrically connect the first mismatch reduction circuit input node to a second node of the pair of analog circuit input nodes during each odd phase of the one or more pairs of even and odd phases; and
        an output switch coupled to the phase controller and configured to electrically connect a first node of the pair of analog circuit output nodes to the first mismatch reduction circuit output node during each even phase of the one or more pairs of even and odd phases and to electrically connect a second node of the pair of analog circuit output nodes to the first mismatch reduction circuit output node during each odd phase of the one or more pairs of even and odd phases,
        wherein the analog circuit includes at least one of an analog-to-digital converter (ADC), a digital-to-analog convertor (DAC), or a comparator, wherein at least one of the ADC, the DAC, or the comparator includes an operational amplifier.

2. The apparatus of claim 1, wherein the analog circuit comprises the DAC, and the DAC includes the operational amplifier.

3. The apparatus of claim 1, wherein the analog circuit comprises the ADC, and the ADC includes the operational amplifier.

4. The apparatus of claim 1, wherein the analog circuit comprises the comparator, and the comparator includes the operational amplifier.

5. The apparatus of claim 4, wherein the analog circuit further comprises the DAC, and the DAC includes a DAC output coupled to the comparator.

6. An apparatus, comprising:
    an analog circuit including a pair of analog circuit input nodes and a pair of analog circuit output nodes; and
    a mismatch reduction circuit including:
        a first mismatch reduction circuit input node;
        a first mismatch reduction circuit output node;
        a phase controller configured to time one or more pairs of even and odd phases;
        an input switch coupled to the phase controller and configured to electrically connect the first mismatch reduction circuit input node to a first node of the pair of analog circuit input nodes during each even phase of the one or more pairs of even and odd phases and to electrically connect the first mismatch reduction circuit input node to a second node of the pair of analog circuit input nodes during each odd phase of the one or more pairs of even and odd phases; and an output switch coupled to the phase controller and configured to electrically connect a first node of the pair of analog circuit output nodes to the first mismatch reduction circuit output node during each even phase of the one or more pairs of even and odd phases and to electrically connect a second node of the pair of analog circuit output nodes to the first mismatch reduction circuit output node during each odd phase of the one or more pairs of even and odd phases, wherein the analog circuit comprises a current mirror.

7. The apparatus of claim 6, wherein analog circuit comprises an analog-to-digital converter (ADC), the ADC including the current mirror.

8. The apparatus of 6, wherein the analog circuit comprises a digital-to-analog convertor (DAC), the DAC including the current mirror.

9. The apparatus of claim 6, wherein the analog circuit comprises a comparator, the comparator including the current mirror.

10. A method or addressing impact of transistor mismatch in an electronic circuit, comprising:

processing an input signal to produce an output signal using at least one of a comparator, an analog-to-digital converter (ADC), or a digital-to-analog convertor (DAC), and wherein at least one of the comparator, the ADC, or the DAC includes an operational amplifier circuit having a pair of differential input nodes, a pair of complementary output nodes, and at least one pair of matching transistors;

timing one or more pairs of even and odd phases;

transmitting the input signal to a first input node of the pair of differential input nodes, and receiving the output signal from a first output node of the pair of complementary output nodes, during each even phase of the one or more pairs of even and odd phases; and transmitting the input signal to a second input node of the pair of differential input nodes, and receiving the output signal from a second output node of the pair of complementary output nodes, during each odd phase of the one or more pairs of even and odd phases.

11. The method of claim 10, further comprising processing a signal using the comparator including the operational amplifier circuit.

12. The method of claim 11, wherein processing the signal comprises calibrating a clock duty cycle using the comparator and a digital-to-analog convertor (DAC) having a DAC output coupled to the comparator.

13. The method of claim 10, further comprising processing a signal using the ADC including the operational amplifier circuit.

14. The method of claim 10, further comprising processing a signal using the DAC including the operational amplifier circuit.

15. A method for addressing impact of transistor mismatch in an electronic circuit, comprising:

processing an input signal to produce an output signal using an electronic circuit, the electronic circuit including a current mirror including an input node, an output node, and at least one pair of matching transistors;

timing one or more pairs of even and odd phases;

transmitting the input signal to the input node of the current mirror, and receiving the output signal from the output node of the current mirror, during each even phase of the one or more pairs of even and odd phases; and transmitting the input signal to the output node of current mirror, and receiving the output signal from the input node of the current mirror, during each odd phase of the one or more pairs of even and odd phases.

16. The method of claim 15, further comprising:

receiving a digital code in the output signal during the one or more pairs of even and odd phases; and averaging the digital code received during the one or more pairs of even and odd phases.

17. The method of claim 15, further comprising processing a signal using a comparator including the current mirror.

18. The method of claim 17, further comprising calibrating a clock duty cycle using the comparator and a digital-to-analog convertor (DAC) having a DAC output coupled to the comparator.

19. The method of claim 15, further comprising processing a signal using an analog-to-digital converter (ADC) including the current mirror.

20. The method of claim 15, further comprising processing a signal using a digital-to-analog convertor (DAC) including the current mirror.

* * * * *